US008456237B2

United States Patent
Huang et al.

(10) Patent No.: US 8,456,237 B2
(45) Date of Patent: Jun. 4, 2013

(54) LOW NOISE VARIABLE GAIN AMPLIFIER UTILIZING VARIABLE FEEDBACK TECHNIQUES WITH CONSTANT INPUT/OUTPUT IMPEDANCE

(75) Inventors: Feng-Jung Huang, San Antonio, TX (US); Jean-Marc Mourant, Dunstable, MA (US)

(73) Assignee: Integrated Device Technology, Inc., San Jose, CA (US)

( * ) Notice: Subject to any disclaimer, the term of this patent is extended or adjusted under 35 U.S.C. 154(b) by 31 days.

(21) Appl. No.: 13/193,604

(22) Filed: Jul. 29, 2011

(65) Prior Publication Data

US 2012/0242408 A1 Sep. 27, 2012

Related U.S. Application Data

(60) Provisional application No. 61/466,475, filed on Mar. 23, 2011.

(51) Int. Cl.
*H03G 3/12* (2006.01)
(52) U.S. Cl.
USPC ............................................ 330/282; 330/279
(58) Field of Classification Search
USPC .................. 330/282, 279, 291, 294
See application file for complete search history.

(56) References Cited

U.S. PATENT DOCUMENTS

| 6,081,159 | A  | * | 6/2000 | Kim et al. ..................... 330/149 |
| 6,882,226 | B2 | * | 4/2005 | Cho et al. ...................... 330/282 |
| 6,919,761 | B2 | * | 7/2005 | Cho et al. ......................... 330/51 |
| 2003/0214357 | A1 | * | 11/2003 | Cho et al. ...................... 330/282 |
| 2004/0080366 | A1 | * | 4/2004 | Ueno et al. ..................... 330/86 |
| 2010/0066452 | A1 | * | 3/2010 | Kawashima et al. ......... 330/293 |
| 2010/0194475 | A1 | * | 8/2010 | Okayama et al. ............. 330/151 |
| 2010/0279631 | A1 | * | 11/2010 | Hosokawa et al. ............. 455/86 |
| 2011/0291764 | A1 | * | 12/2011 | Kobayashi .................... 330/294 |

* cited by examiner

*Primary Examiner* — Henry Choe
(74) *Attorney, Agent, or Firm* — Tracy Parris

(57) ABSTRACT

Variable feedback architecture and control techniques for variable gain amplifiers (VGAs) concurrently maintain, across a wide range of VGA gain settings, minimal input and output impedance variations, a low noise figure, low rates of change in noise figure, high signal-to-noise ratio (SNR), high quality of service (QoS), low distortion, high and relatively constant output third order intercept point (i.e., IP3 or TOI). Variable feedback counteracts impedance variations caused by gain variations. Compared to conventional high performance VGAs, noise figure is lower (e.g. 3 dB lower at maximum gain and 12 dB lower at minimum gain) and relatively constant, IP3 is higher and relatively constant, small signal third order intermodulation signal (IM3) tone slope is relatively constant and input and output impedances are relatively constant. As gain decreases, the noise figure advantage is nearly dB per dB compared to conventional high performance VGAs.

20 Claims, 5 Drawing Sheets

LOW NOISE VARIABLE GAIN AMPLIFIER UTILIZING VARIABLE FEEDBACK TECHNIQUES WITH CONSTANT INPUT/OUTPUT IMPEDANCE

CROSS-REFERENCE TO RELATED APPLICATIONS

This application claims the benefit of U.S. Provisional Patent Application No. 61/466,475, filed Mar. 23, 2011 and entitled, "Low Noise Variable Gain Amplifier Utilizing Variable Feedback Techniques with Constant Input/Output Impedance," which is hereby incorporated by reference in its entirety as if fully set forth herein.

TECHNICAL FIELD

The present invention generally relates to amplification. More particularly, the invention relates to low noise, variable gain amplification.

BACKGROUND

Some conventional high performance variable gain amplifiers (VGAs) use dominant fixed resistors at VGA input and output to try to minimize input and output impedance variations. For example, if a change in gain would otherwise result in a change in impedance from 10 to 100 Ohms, adding a dominant 1000 Ohm resistor in series would reduce the overall variation to less than 10%. However, this impedance control technique dramatically degrades noise and/or linearity performance of VGAs.

Other conventional high performance VGAs utilize a variable attenuator followed by a fixed gain amplifier. As a result, as gain decreases the noise figure (NF), which measures degradation of the signal-to-noise ratio, of conventional VGAs degrades decibel per decibel (dB per dB). In other words, the NF increases approximately one dB for every dB decrease in gain of a conventional high performance VGA.

FIG. 1 illustrates a prior art variable gain current feedback amplifier disclosed in U.S. Pat. No. 6,906,595. As illustrated, prior art variable current gain current feedback amplifier 10 comprises operational amplifier A16, transistor Q15, input and output terminals, IN, OUT, fixed input and output resistors R11, R12, variable resistors R13, R14, and power, ground terminations VCC, GND. In particular, amplifier 10 is a variable current gain current feedback amplifier. The input impedance of amplifier 10 is primarily set by input resistor R11. This design results in relatively high noise due to the noise contribution of input resistor RE An additional problem is that the output impedance varies as the current gain varies. This architecture requires additional circuits or stages shown in other drawings of U.S. Pat. No. 6,906,595 for output impedance matching.

A second prior art reference entitled, "A Wideband Low-Noise Variable-Gain BiCMOS Transimpedance Amplifier," was presented by Robert G. Meyer and William D. Mack in IEEE JOURNAL OF SOLID-STATE CIRCUITS, VOL. 29, NO. 6. June 1994. This reference discloses a variable gain transimpedance amplifier. The architecture described by this requires an additional stage, i.e., an output stage, with a series resistor to provide output impedance matching.

The state of the art before the present invention is exemplified by the data sheet for Analog Devices part number AD8376, which, according to Analog Devices, is an "Ultra low distortion IF Dual VGA." According to the data sheet for AD8376 (not shown), gain is varied by adding power loss at the input of a fixed gain amplifier. As a result, the noise figure degrades by 1 dB for every 1 dB step in gain. If the power loss is placed at the output of the fixed gain amplifier, it is the output IP3 (output third order intercept point or IP3o) that varies 1 dBm/dB instead of the noise figure. If the power loss is added at both input and output to vary gain, split the difference and lose 0.5 dB of NF AND 0.5 dB of output IP3 for each 1 dB gain step. Other state of the art VGAs are exemplified by data sheets for Maxim part numbers MAX2027 and MAX2055 (not shown).

Prior art VGAs are problematic because they fail to achieve high levels of performance with regard to each of impedance variation, NF and IP3. For example, some prior art designs sacrifice NF in favor of minimizing impedance variations. Some prior art designs implement lossy resistive networks at VGA input while others implement them at VGA output. A lossy resistive network at the input degrades NF while a lossy resistive network at the output degrades IP3. Thus, there is a need for a VGA that achieves high levels of performance with regard to each of impedance variation, NF and IP3.

SUMMARY

This Summary is provided to introduce concepts in a simplified form. These concepts are described in greater detail below in the sections entitled Detailed Description Of Illustrative Embodiments, Brief Description of the Drawings, Claims, and in FIGS. 2-7. This Summary is not intended to identify key or essential features of the described or claimed subject matter, nor limit the scope thereof.

Variable feedback architecture and variable feedback control techniques are used in variable gain amplifiers (VGAs) to concurrently maintain, across a wide range of VGA gain settings, minimal input and output impedance variations, a low noise figure, low rates of change in the noise figure, high signal-to-noise ratio (SNR), high quality of service (QoS), low distortion provides increased spurious-free dynamic range (SFDR), high and relatively constant output third order intercept point (i.e., IP3 or TOI). Variable feedback from variable components, for example, counteracts impedance variations caused by gain variations. Compared to conventional high performance VGAs, noise figure is lower (e.g. 3 dB lower at maximum gain and 12 dB lower at minimum gain) and relatively constant, IP3 is higher and relatively constant, small signal third order intermodulation signal (IM3) tone slope is relatively constant and input and output impedances are relatively constant. As gain decreases, the noise figure advantage is nearly dB per dB compared to conventional high performance VGAs.

A device in accordance with an embodiment of the invention may comprise, for example, a VGA having one or more variable feedbacks and/or a variable feedback controller to provide coordinated control of the one or more variable feedbacks. There are numerous ways for variable feedbacks to provide variable feedback performance. One way is for each variable feedback to have one or more variable components under coordinated control. At least two variable components under coordinated control may provide at least one complementary control function. For example, a first variable component may concurrently increase gain and decrease input and/or output impedance and a second variable component may concurrently increase gain and increase input and/or output impedance. Thus, one or more variable components may compensate or counteract undesirable variations in performance. Coordinated control of multiple variable components causes the VGA to concurrently control gain, compensate input and/or output impedance and maintain a 0.4 dB or less (e.g. 0.2 dB) change in noise figure for a 1 dB change in gain of the amplifier over a wide range of gain settings of a VGA. Also, noise figure may be maintained at 5 dB or less throughout a VGA's operational gain range. High (e.g., 44 dBm, 51 dBm) and relatively constant output IP3 may be maintained across a wide range of gain settings of a VGA. Relatively constant input and output impedance may also be maintained, e.g., a 50% or less change in magnitude. These levels of performance may be maintained over a wide range, e.g., over 5 dB, 10 dB, 14 dB or 20 dB range of gain of the VGA.

BRIEF DESCRIPTION OF THE DRAWINGS

The foregoing summary, as well as the following detailed description, is better understood when read in conjunction with the accompanying drawings. The accompanying drawings, which are incorporated herein and form part of the specification, illustrate a plurality of embodiments of the present invention and, together with the description, further serve to explain the principles involved and to enable a person skilled in the relevant art(s) to make and use the disclosed technologies. However, embodiments of the invention are not limited to the specific implementations disclosed herein. Unless expressly indicated, each figure represents a different embodiment and components in each embodiment are intentionally numbered differently compared to potentially similar components in other embodiments.

DETAILED DESCRIPTION OF ILLUSTRATIVE EMBODIMENTS

Figure 1:
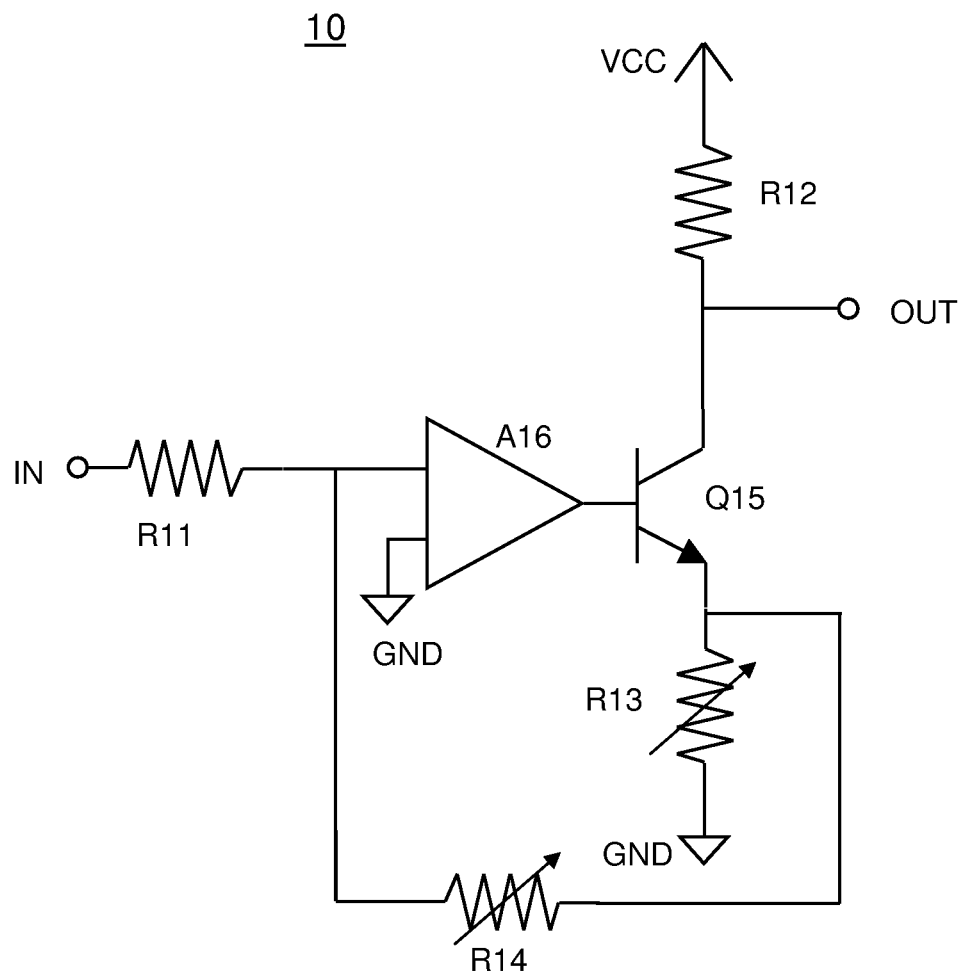
FIG. 1 illustrates a prior art variable current gain current feedback amplifier.

Reference will now be made to embodiments of the invention, examples of which are illustrated in the accompanying drawings. While the technology will be described in conjunction with various embodiments, it will be understood that the embodiments are not intended to limit the present technology. On the contrary, the present technology is intended to cover alternatives, modifications, and equivalents, which may be included within the spirit and scope the various embodiments as defined herein, including by the appended claims. In addition, in the following detailed description, numerous specific details are set forth in order to provide a thorough understanding of the present technology. However, the present technology may be practiced without these specific details. In other instances, well known methods, procedures, components, and circuits have not been described in detail as not to unnecessarily obscure aspects of the embodiments presented.

References in the specification to "embodiment," "example embodiment," or the like, indicate that the embodiment described may include a particular feature, structure, characteristic or step, but every embodiment may not necessarily include the particular feature, structure, characteristic or step. Moreover, such phrases are not necessarily referring to the same embodiment. Furthermore, when a particular feature, structure, or characteristic is described in connection with an embodiment, it is submitted that it is within the knowledge of one skilled in the art to implement such feature, structure, or characteristic in connection with other embodiments whether or not explicitly described.

Unless specifically stated otherwise, terms such as "sampling," "latching," "determining," "selecting, "storing," "registering," "creating," "including," "comparing," "receiving," "providing," "generating," "associating," and "arranging", or the like, refer to the actions and processes of an electronic device that manipulates and transforms data represented as physical (electronic) quantities within the electronic device. The terms "logic," "function," "step," and the like refer to functionality that may be implemented by hardware (digital and/or analog) or a combination of hardware, software and/or firmware. Unless specifically indicated, described and claimed functionality may be implemented by hardware (digital and/or analog) or a combination of hardware, software and/or firmware. The term "programmable" and the like refer to functionality permitting definition or selection of functionality to vary performance of logic from one embodiment to the next, whether one-time or any number of times such as by reprogrammable functionality.

Certain terms are used throughout the following description and claims to refer to particular system components and configurations. As one skilled in the art will appreciate, various skilled artisans and companies may refer to a component by different names. The discussion of embodiments is not intended to distinguish between components that differ in name but not function. In the following discussion and in the claims, the terms "including" and "comprising" are used in an open-ended fashion, and thus should be interpreted to mean "including, but not limited to . . . " Also, the term "couple" or "couples" is intended to mean either an indirect or direct electrical connection. Thus, if a first device couples to a second device, that connection may be through a direct electrical connection or though an indirect electrical connection via other devices and connections. Furthermore, the term "information" is intended to refer to any data, instructions, or control sequences that may be communicated between components of a device. For example, if information is sent between two components, data, instructions, control sequences, or any combination thereof may be sent between the two components.

Figure 2:
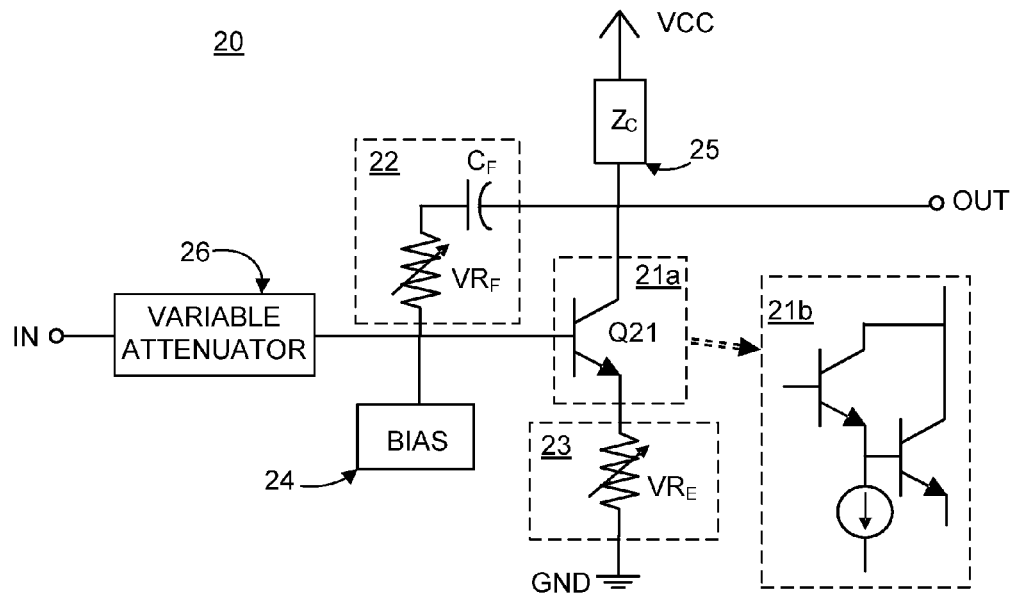
FIG. 2 illustrates a single-ended IF/RF variable gain amplifier with variable feedbacks in accordance with an embodiment of the invention.

FIG. 2 illustrates a single-ended Intermediate-Frequency (IF)/Radio-Frequency (RF) variable gain amplifier (VGA) with variable feedbacks in accordance with an embodiment of the invention. In the illustrated embodiment, variable feedback VGA 20 comprises transistor Q21, first variable feedback 22, second variable feedback 23, bias 24, impedance 25 and variable attenuator 26.

Referring to the architecture of variable feedback VGA 20 illustrated in FIG. 2, variable feedback VGA 20 comprises a single stage, although in other embodiments there may be additional input and/or output stages. First variable feedback 22 is coupled between an input terminal IN and an output terminal OUT of VGA 20. Of course coupling to input terminal IN may be direct, as where variable attenuator 26 is absent from VGA 20, or indirect, as where variable attenuator 26 is included in VGA 20. Second variable impedance 23 is coupled to ground GND. More specifically, VGA 20 comprises a common emitter (CE) configured transistor Q21 having a base, collector and emitter. First variable feedback 22 is coupled between the base and collector of transistor Q21. Second variable feedback 23 is coupled between the emitter of transistor Q21 and ground GND. Ground GND may be signal, Earth, chassis or other ground and may also be referred to as common or return. Impedance 25 is coupled between the collector of transistor Q21 and power source VCC. The base of transistor Q21 is biased by bias 24. Variable attenuator 26 is optionally coupled between input terminal IN and the base of transistor Q21.

Transistor Q21 is shown as a bipolar junction transistor (BJT). However, in other embodiments, transistor Q21 can be a bipolar device, e.g., BJT or heterojunction bipolar transistor (HBT), a metal oxide field effect transistor (MOSFET) device, metal semiconductor field effect transistor (MESFET) device or other transconductor or transistor technology device. Such alternative devices may require alternative configurations other than the configuration illustrated in FIG. 2. In addition, transistor Q21 can be either single device configuration 21a or multiple device configuration 21b, such as a Darlington configuration shown in FIG. 2. Although FIG. 2 illustrates transistor Q21 in a common emitter configuration, other embodiments may implement other configurations. In one embodiment, emitter area of a BJT implementation of transistor Q21 may be approximately 300 $\mu m^2$.

Although the embodiment shown in FIG. 2 has two variable feedbacks, the number of variable feedbacks may vary between embodiments. In other embodiments there may be more or fewer than two variable feedbacks. A reference to a variable feedback herein comprises one or more variable feedbacks. Thus, variable feedback could be a single variable feedback with multiple variable/controllable components or plurality of variable feedbacks each with at least one variable component and/or other method of varying feedback performance.

The type of variable feedback may vary between embodiments. For example, feedback may comprise current feedback and/or voltage feedback. In some embodiments, magnitudes of variable components may be varied while in other embodiments bias, reference or signals, e.g., current, voltage or frequency, may be varied for fixed or variable components to provide variable feedback performance. Other embodiments may combine several variable feedback techniques. Thus, variable feedback may comprise coordinated control of a plurality of variable feedbacks each having one or more variable components, coordinated control of a plurality of variable components in one variable feedback, coordinated control of a plurality of signals or supply voltage, current, reference for fixed or variable components, etc. The type of variable feedback component(s) may also vary between embodiments. A variable feedback may comprise a variable impedance. In some embodiments resistor components may vary while in other embodiments other components, such as capacitors and inductors, may be varied alternatively or in concert with other feedback components.

First variable feedback 22 comprises first variable resistor $VR_F$ and capacitor $C_F$. In other embodiments, first variable feedback 22 may comprise other components, including additional or alternative variable components. Further, in other embodiments, first variable feedback 22 may have an alternative configuration, i.e., the architecture of VGA 20 and configuration of multiple variable feedbacks shown in FIG. 2 may vary between embodiments.

Second variable feedback 23 comprises second variable resistor $VR_E$, which may also be known as an emitter degeneration resistor. In some embodiments, depending on the operating frequency, second variable resistor $VR_E$, may be replaced with an inductor having a finite inductor quality factor.

Variable resistors $VR_F$ and $VR_E$ may be implemented with integrated thin film metal resistors, polysilicon resistors, junction resistors, FET resistors, diffusion resistors, other integrated circuit technology resistors, discrete resistors and/or any combination thereof. Variable resistors $VR_F$ and $VR_E$ may also be implemented by digital or analog attenuators. In some embodiments, variable impedance may comprise a plurality of switches that switch a plurality of impedances in and out of the variable feedback. In some embodiments, $VR_E$ and/or $VR_F$ may comprise one or more switches (e.g. MOSFET switches) that incrementally switch a plurality of impedances (e.g. fixed resistors) in and out of the variable feedbacks to vary $VR_E$ and $VR_F$, e.g., in response to a control code word.

Capacitor $C_F$ is a DC blocking capacitor. Capacitor $C_F$ may be implemented with a MOS capacitor, a metal-insulator-metal capacitor, other integrated circuit technology capacitors or discrete capacitors. Capacitor $C_F$ is operating frequency dependent. For example, in some embodiments, capacitor $C_F$ may be approximately 100 pF for an operating frequency range from 50 to 160 MHz. In some embodiments, the functionality of $C_F$ may be replaced with other circuitry, such as a level shifting amplifier.

Optional variable attenuator 26 is implemented at input terminal IN. Some embodiments may implement input and/or output attenuators. While variable attenuator 26 at the input of variable feedback VGA 20 may increase the gain control range of variable feedback VGA 20, it may also introduce additional noise, thereby increasing the noise factor of variable feedback VGA 20.

Current is supplied to variable feedback VGA 20 from source VCC through impedance 25, i.e., collector impedance $Z_C$. To achieve high linearity, in some embodiments, collector impedance $Z_C$ may comprise a low DC resistance and high quality factor inductor. Bias circuit 24 provides bias to the base of Q1.

The input and output of variable feedback VGA 20 are matched, respectively, to source and load impedances. The input impedance of Variable feedback VGA 20 is designed to be equal to a source impedance (not shown) and the output impedance of variable feedback VGA 20 is designed to be equal to a load impedance (not shown). During operation, variable feedbacks are controlled to match the input and output impedances of variable feedback VGA 20 as closely as possible to source and load impedances.

It is notable that variations in input and output impedance due to variations in gain may not be as much of an issue with lower frequency, longer wavelength signal amplification. However, impedance variations caused by gain variations become increasingly relevant with increasing frequency, shorter wavelength signal amplification.

Gain of variable feedback VGA 20 may be controlled, for example, by changing one or more of bias 24, first variable resistor $VR_F$ and second variable resistor $VR_E$. Changing gain may also change, in some cases undesirably, input and/or output impedance of variable feedback VGA 20. However, coordinated control of variable feedbacks permits compensation for undesirable performance of variable feedback VGA 20. For example, control of multiple variable components may be coordinated to provide a common function pertaining to gain, e.g., both increasing or both decreasing gain, while concurrently providing an inverted or offset function, e.g., one increasing impedance while the other compensates by decreasing impedance. Whether a function is deemed wholly or partly complementary (i.e. inverted) of another function is a matter of perspective about what the functions are. If the several functions provided by a variable component (e.g. gain function/performance and impedance function/performance) are deemed a single function then the performance of several competing functions provided by several variable components may be deemed a partially inverted or complementary function rather than a wholly inverted or complementary function. Thus, use of the term complementary alone herein encompasses both partially and wholly complementary functions. Other terms besides counteract, compensate, invert and offset that may describe competing functions include, but are not limited to adjust, adapt, regulate and correct. The magnitudes of competing functions may or may not be equal, e.g., the magnitude of one function may be multiple times more influential than the magnitude of another function.

The functions provided by first variable resistor $VR_F$ and second variable resistor $VR_E$ can be coordinated to achieve relatively constant input and output impedances for variable feedback VGA 20 over a wide range of gain settings by properly selecting values for first variable resistor $VR_F$ and second variable resistor $VR_E$ in variable feedback loops. Several functions provided by first and second variable resistors $VR_F$ and $VR_E$ follow. Increasing first variable resistor $VR_F$ will increase the input and output impedances of variable feedback VGA 20 and concurrently increase the gain of variable feedback VGA 20. Decreasing first variable resistor $VR_F$ will decrease the input and output impedances of variable feedback VGA 20 and concurrently decrease the gain of variable feedback VGA 20. Increasing second variable resistor $VR_E$ will increase the input and output impedances of variable feedback VGA 20 and concurrently decrease the gain of VGA 20. Decreasing second variable resistor $VR_E$ will decrease the input and output impedances of variable feedback VGA 20 and concurrently increase the gain of variable feedback VGA 20.

An exemplary complementary control function may be provided by coordinated control of first variable resistor $VR_F$ to concurrently increase gain and increase the input and output impedance and by control of second variable resistor $VR_E$ to concurrently increase gain and decrease the input and output impedance of variable feedback VGA 20. Thereby, coordinated control of first variable resistor $VR_F$ and second variable resistor $VR_E$ can be used to compensate at least one of an input and output impedance of variable feedback VGA 20 to minimize a difference between, respectively, at least one of a reference input (i.e. source) and a reference output (i.e. load) impedance.

FIG. 2 does not show a variable feedback controller configured to control first and second variable feedbacks 22 and 23, nor does it show controllers for bias 24 and variable attenuator 26. However, a generalized block diagram of such controllers is shown in and discussed relative to FIGS. 3 and 4.

Figure 3:
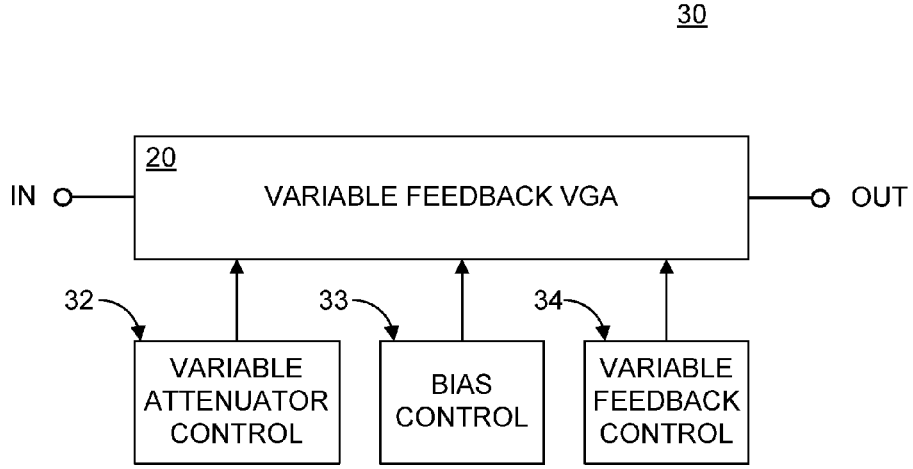
FIG. 3 illustrates exemplary coordinated variable feedback control in accordance with an embodiment of the invention.

FIG. 3 illustrates exemplary coordinated variable feedback control of variable components in accordance with an embodiment of the invention. Device 30 comprises variable feedback VGA 20, variable attenuator control 32, bias control 33 and variable feedback control 34. Device 30 is a machine or manufacture as defined by 35 U.S.C. §101. Device 30 may comprise, for example but not limited to, an amplifier, attenuator, intermediate frequency (IF) device, radio frequency (RF) device, wireless device, communications device, radio system, receiver, transmitter, transceiver, base station equipment, etc.

Variable feedback VGA 20 may comprise, for example, variable feedback VGA 20 in FIG. 2 or one of many other variable feedback VGAs embodying one or more aspects of the invention. Optional variable attenuator control 32 controls optional variable attenuator 26 to extend the range of variable feedback VGA 20. Bias control 33 controls bias 24. Variable feedback control 34 provides control of first and second variable feedbacks 22 and 23. Specifically, in this embodiment, Variable feedback control 34 provides coordinated control of first variable resistor $VR_F$ and second variable resistor $VR_E$ in variable feedback VGA 20.

Each controller 32, 33, 34 may be implemented digitally, in analog circuitry or a combination thereof. Control may be developed dynamically in real time or may be predetermined. Each controller 32, 33, 34 may be implemented in hardware or a combination of hardware and software or firmware. Thus, for example, variable feedback control 34 may provide continuous or incremental control of the magnitude of a variable component, gain, input and output impedance of the amplifier. As a result, the variable magnitude or value of first and second variable resistors $VR_F$ and $VR_E$ versus gain may be continuous or discrete/incremental. The number of variable feedback increments may vary between embodiments. For example, in some embodiments, there may be 32 or 64 increments of variable resistance. In other embodiments, there may be more or fewer incremental variations. The impact or functional result of incremental variations may also vary from one embodiment to the next. In some embodiments, increments may result in ¼ dB or ½ dB fixed or variable changes or increments while in other embodiments the incremental impact may be more or less.

A digital implementation of variable feedback control 34 may include predefined, coordinated control of one or more variable components, e.g., first variable resistor $VR_F$ and second variable resistor $VR_E$, specified in a table stored in memory that is accessed and/or selected by logic gates or a processor. A table, e.g., a lookup table, may store values or code words providing both variable gain and variable feedback settings, to concurrently provide desired gain settings and relatively constant input and output impedances over a wide range of gain settings. In another embodiment, a control word input may be decoded by variable feedback control 34 to control variable components within one or more variable feedbacks.

Variable feedback control 34 may concurrently provide gain control as well as input and output impedance matching to a reference source impedance and a reference load impedance by coordinated, concurrent control of first variable resistor $VR_F$ and second variable resistor $VR_E$. Embodiments herein focus on changing the configuration, characteristics and/or performance of variable feedbacks by changing the magnitude of variable components in variable feedbacks. However, variations, whether discrete or continuous, introduced by variable feedback control 34 may change the configuration, characteristics and/or performance of variable feedbacks, e.g., first and second variable feedbacks 22, 23, for example but not limited to, by switching component(s) in and out of variable feedbacks, changing the magnitude of component(s) in variable feedbacks, changing bias, power or reference supplied to component(s) in variable feedbacks or otherwise varying configuration, characteristics and performance to provide variable feedback.

Figure 4:
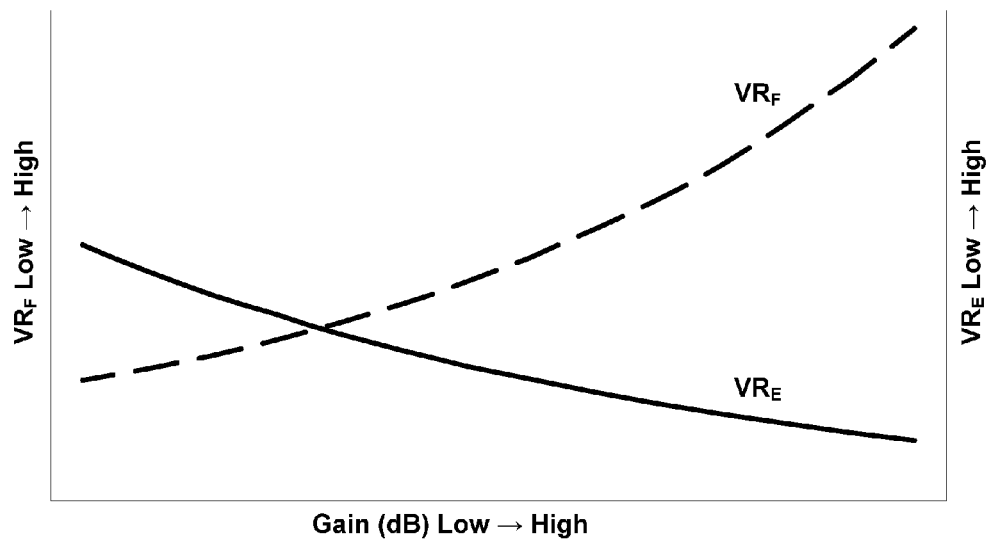
FIG. 4 illustrates exemplary coordinated variable feedback control of variable components in accordance with an embodiment of the invention illustrated in FIGS. 2 and 3.

FIG. 4 illustrates exemplary coordinated variable feedback control by varying the magnitude of first and second variable resistors $VR_F$ and $VR_E$ in accordance with the embodiment of the invention illustrated in FIGS. 2 and 3. Note that the y-axes in FIG. 4 are not necessarily the same scale. As illustrated by coordinated control chart 34 in FIG. 4, at maximum designed gain of VGA 20, resistance of first variable resistor $VR_F$ is at its highest magnitude and resistance of second variable resistor $VR_E$ is at its lowest magnitude. At minimum designed gain of VGA 20, resistance of first variable resistor $VR_F$ is at its lowest magnitude and resistance of second variable resistor $VR_E$ is at its highest magnitude.

What is not shown in FIG. 4 is the potentially undesirable effect on input and output impedances as gain varies. As first variable resistor $VR_F$ increases, the input and output impedances of VGA 20 increase concurrently with an increase in the gain of VGA 20. This is compensated by decreasing second variable resistor $VR_E$, which decreases the input and output impedances of VGA 20 while concurrently increasing the gain of VGA 20. The compensation may be considered in reverse, with first variable resistor $VR_F$ being adjusted to compensate for impedance variations caused by variation of second variable resistor $VR_E$. As first variable resistor $VR_F$ decreases, the input and output impedances of VGA 20 decrease concurrently with a decrease in the gain of VGA 20. This is compensated by increasing second variable resistor $VR_E$, which increases the input and output impedances of VGA 20 and concurrently decreases the gain of VGA 20. The compensation may be considered in reverse, with first variable resistor $VR_F$ being adjusted to compensate for impedance variations caused by variation of second variable resistor $VR_E$.

In some embodiments, control of first and second variable resistors may be provided in the form of at least one control word. There may be at least one control code word for each of the variable gain settings of the amplifier. Control words may be applied directly or decoded to control variable components. For example, each control code word may be applied to control a plurality of switches and/or multiplexers (not shown) that control variable feedback. In some embodiments as the control word increases the gain decreases while in other embodiments as the control word increases the gain increases.

Variable feedback control may be implemented in accordance with one or more control algorithms. The magnitude and range of variable impedances such as first and second variable resistors $VR_E$ and $VR_F$ and variable impedance control may vary between embodiments. In some embodiments configured as shown in FIG. 4, a general design guide that can be used to design first and second variable feedback resistors $VR_E$ and $VR_F$ is provided as Equation 1 and Equation 2 below:

$$VR_F = R_S \times (1 + \sqrt{G_t}) \quad \text{Equation 1}$$

$$VR_E = R_S \times (R_S \div VR_F) \quad \text{Equation 2}$$

where $G_t$ is the available power gain (not in dB) and $R_S$ is the input and output resistance, which are assumed to be the same. Of course Equations 1 and 2 provide only a general guide. Each design and implementation may require analyses and experimentation in the normal course of design and implementation to achieve the best or at least the most acceptable performance in view of design constraints and component tolerances. While input and output resistance $R_S$ is the same in this embodiment and in Equations 1 and 2, in other embodiments, input and output impedance may be different and may require different guide equations. The operating range, maximum gain and minimum gain may vary between embodiments of the invention.

Table 1 provides an exemplary embodiment of control of first and second variable resistors $VR_E$ and $VR_F$ depicted in FIG. 4.

TABLE 1

| Control Word | Gain (dB) | $VR_F$ (Ohms) | $VR_E$ (Ohms) |
|---|---|---|---|
| 1101 | 9 | 381.8 | 26.2 |
| 1100 | 10 | 416.2 | 24.0 |
| 1011 | 11 | 454.8 | 22.0 |
| 1010 | 12 | 498.1 | 20.1 |
| 1001 | 13 | 546.7 | 18.3 |
| 1000 | 14 | 601.2 | 16.6 |
| 0111 | 15 | 662.3 | 15.1 |
| 0110 | 16 | 731.0 | 13.7 |
| 0101 | 17 | 807.9 | 12.4 |
| 0100 | 18 | 894.3 | 11.2 |
| 0011 | 19 | 991.3 | 10.1 |
| 0010 | 20 | 1100.0 | 9.1 |
| 0001 | 21 | 1222.0 | 8.2 |
| 0000 | 22 | 1358.9 | 7.4 |

As generally illustrated in FIG. 4, it can be seen in Table 1 that incrementing control word from 1101 to 0000 causes first variable resistor $VR_F$ to increase from 381.8 Ohms to 1,358.9 Ohms and second variable resistor $VR_F$ to decrease from 26.2 Ohms to 7.4 Ohms. This results in the gain of VGA 20 being adjusted from 9 to 22 dB while it also maintains nearly constant input and output impedances for VGA 20. In some embodiments, as the code word increases, gain decreases while in other embodiments, as the code word increases, gain increases. The number of control words, which may be based on the number of bits, provides control resolution. The control resolution and the range of gain control may vary between embodiments.

Control words may be implemented using binary, thermometer or another coding scheme. In thermometer coding, there is one digital level for each code or control word. For example, an 8-bit control word using thermometer coding would provide 256 control levels, one for each unique combination of 8 bits. In an example of binary coding, there may be four switches providing 1, 2, 4 and 8 dB gain steps. These switches may be controlled to add and subtract these gain steps to provide 1, 2, 3, 4, 5, etc., gain steps. Although fewer control bits may be used to provide multiple states per control word, such binary coding techniques may impact accuracy. Control resolution over the operating range of a VGA may vary among embodiments. Higher resolution feedback control, e.g., greater number of control bits providing greater number of control settings, may provide improved accuracy in control or compensation of gain, impedance and other operational characteristics.

Figure 5:
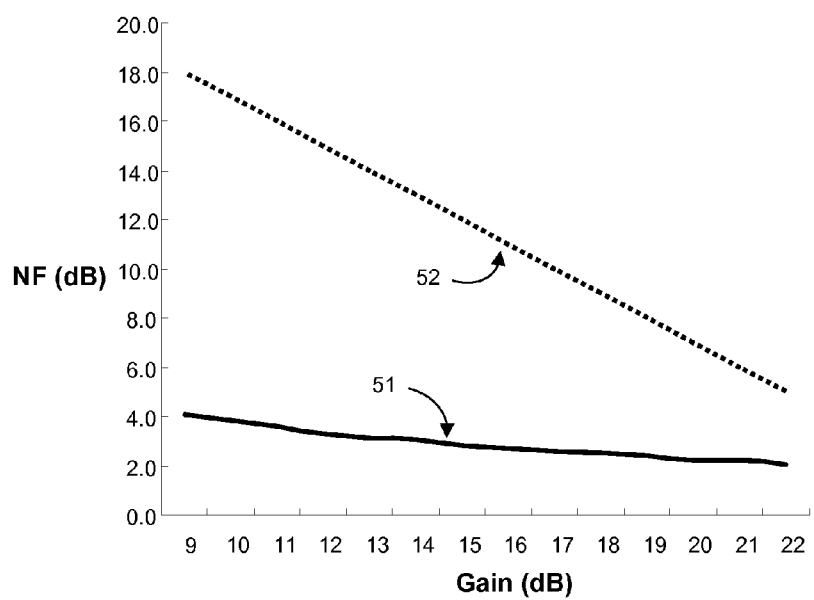
FIG. 5 illustrates exemplary noise figure (NF) versus gain settings in accordance with an embodiment of the invention relative to a conventional VGA.
Figure 6A:
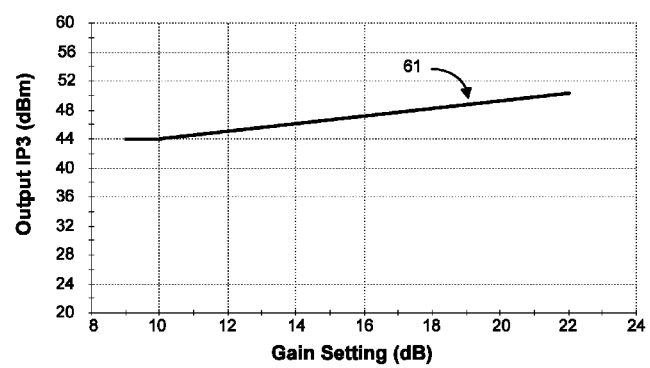
FIGS. 6A and 6B illustrate output IP3 versus gain for embodiments of the invention.
Figure 6B:
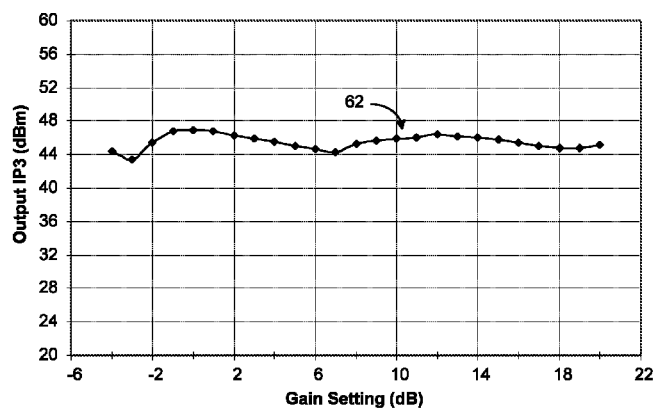

Several advantages provided by embodiments of the invention are illustrated in FIGS. 5, 6A and 6B. FIG. 5 illustrates exemplary noise figure (NF) versus gain settings in accordance with an embodiment of the invention relative to NF for a conventional VGA. Specifically, FIG. 5 illustrates exemplary noise FIG. 51 for VGA 20 relative to conventional noise FIG. 52 for a conventional VGA such as Analog Devices AD8376. FIG. 5 illustrates two different qualities of NF. First, the rate of change of NF versus the rate of change of gain (incrementally and on average) is low and the magnitude of NF is low over a wide range of gain settings of the VGA. Exemplary NF 51 resulting from operation of an embodiment of VGA 20 maintains a low noise figure (e.g. 5 dB, 4 dB, 2 dB) and a low incremental and average rate of change in noise figure (e.g., 0.5 dB, 0.4 dB, 0.2 dB) for each 1 dB change over a wide range of gain settings (e.g. 5 dB, 10 dB, 15 dB, 20 dB). On average, for example, a rate of change in NF may be 5 dB, 4 dB or 2 dB over a gain range of 10 dB. The increments may be consecutive or a cumulative total of consecutive and non-consecutive increments. Results may vary between embodiments. As illustrated in this embodiment, exemplary NF 51 maintains a 0.4 dB or less change in NF for each 1 dB change in gain from 9 to 22 dB. Exemplary NF 51 maintains a 0.2 dB or less change in NF for each 1 dB change in gain over gain settings from 12 to 22 dB. Exemplary NF 51 maintains a 5 dB or less NF over gain settings from 9 to 22 dB. Exemplary NF 51 ranges from 2 dB to 4 dB. In comparison, conventional NF 52 ranges from 18 dB to 5 dB over a gain range of 9 to 22 dB, which is a rate of change in NF of 1 dB per 1 dB change in gain. Thus, it can be seen in FIG. 5 that the noise figure of embodiments of the invention is significantly lower than a conventional VGA, especially near low gain settings.

FIGS. 6A and 6B illustrate output IP3 versus gain for embodiments of the invention. FIGS. 6A and 6B each illustrate two different qualities of output IP3. First, the rate of change of output IP3 versus the rate of change of gain is low and the magnitude of output IP3 is high over a wide range of gain settings of the VGA. Various embodiments may be designed and controlled to amplify signals within a particular range of frequencies, e.g., 240-300 MHz, 160-260 MHz, 50-150 MHz. Such range-specific devices may be centered, for example, at 270 MHz, 200 MHz and 100 MHz. FIGS. 6A and 6B illustrate that embodiments maintain a high (e.g. 44 dBm, 48 dBm, 51 dBm) and relatively constant incremental and average output IP3 over a wide range of variable gain settings (e.g. 5 dB, 10 dB, 14 dB, 20 dB). The increments may be consecutive or a cumulative total of consecutive and non-consecutive increments. Results may vary between embodiments.

FIG. 6A illustrates the output IP3 performance of an embodiment of VGA 20 without variable attenuator 26. The gain range illustrated is 9 to 22 dB. FIG. 6A illustrates output IP3 performance for a signal having a frequency of 100 MHz provided at input terminal IN. As shown in FIG. 6A, exemplary output IP3 61 measured at output terminal OUT resulting from operation of an embodiment of VGA 20 is 44.00 dBm at a gain setting of 9 dB, 44.05 dBm at a gain setting of 10 dB and 50.37 dBm at a gain setting of 22 dB. Exemplary IP3 61 maintains a 44 dBm to 51 dBm output IP3 over gain from 9 to 22 dB.

FIG. 6B illustrates the output IP3 performance of an embodiment of VGA 20 with variable attenuator 26. The gain range illustrated is −4 to 20 dB. FIG. 6B illustrates output IP3 performance for a signal having a frequency of 200 MHz provided at input terminal IN. While the gain range of VGA 20 may be 9 to 22 dB without variable attenuator 26, the gain range may be extended to −4 to 20 dB with variable attenuator 26. In this embodiment, the advantage is an increase in the lower end of gain. However, variable attenuator 26 may introduce noise and thereby increase the noise factor (NF) of VGA 20. For example, if variable attenuator 26 comprises a single attenuator having a minimum insertion loss of 1 dB, and if the NF of VGA 20 without variable attenuator is 4 dB, then the total cascaded NF may be 5 dB. If variable attenuator 26 comprises two attenuators each having a minimum insertion loss of 1 dB, and if the NF of VGA 20 without variable attenuator is 4 dB, then the total cascaded NF may be 6 dB.

As shown in FIG. 6B, exemplary output IP3 62 measured at output terminal OUT resulting from operation of an embodiment of VGA 20 is 44.43 dBm at a gain setting of −4 dB, 46.24 dBm at a gain setting of 2 dB, 45.32 dBm at a gain setting of 8 dB, 46.02 dBm at a gain setting of 14 dB and 45.17 dBm at a gain setting of 20 dB. Table 2 illustrates incremental changes in output IP3 measured at output terminal OUT in response to a wide range of gain settings. Exemplary IP3 62 maintains a 43.40 dBm to 46.95 dBm output IP3 over gain from −4 to 20 dB. Exemplary output IP3 62 maintains an average of 45.50 dBm for gain settings −4 to 20 dB. Exemplary output IP3 62 maintains a 0.4 dB or less change in output IP3 for each 1 dB change in gain from 12 to 19 dB.

TABLE 2

| Gain | IP3 |
| --- | --- |
| 20 | 45.17 |
| 19 | 44.74 |
| 18 | 44.73 |
| 17 | 45.02 |
| 16 | 45.38 |
| 15 | 45.73 |
| 14 | 46.02 |
| 13 | 46.18 |
| 12 | 46.47 |
| 11 | 45.98 |
| 10 | 45.96 |
| 9 | 45.62 |
| 8 | 45.32 |
| 7 | 44.31 |
| 6 | 44.66 |
| 5 | 45.09 |
| 4 | 45.54 |
| 3 | 45.87 |
| 2 | 46.24 |
| 1 | 46.78 |
| 0 | 46.95 |
| −1 | 46.75 |
| −2 | 45.38 |
| −3 | 43.40 |
| −4 | 44.43 |

Figure 7:
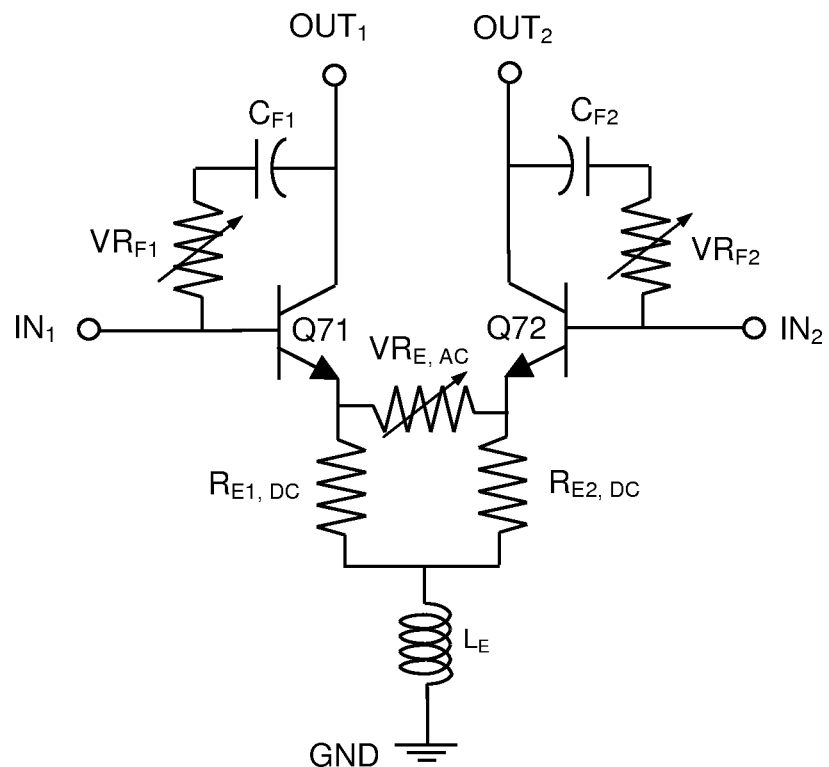
FIG. 7 illustrates fully differential IF/RF matched variable gain amplifier with variable feedbacks in accordance with an embodiment of the invention.

FIG. 7 illustrates a fully differential IF/RF matched variable gain amplifier with variable feedbacks in accordance with an embodiment of the invention. This differential implementation is similar in configuration to the single-ended implementation shown in FIG. 4 except for the emitter feedback configuration. Also, bias circuit and collector impedance illustrated in FIG. 2, which may be present in some embodiments, are not shown for simplicity. Differential variable feedback VGA 70 comprises first transistor Q71, first I/O feedback capacitor $C_{F1}$, first I/O variable feedback resistor $VR_{F1}$, first emitter resistor $R_{E1, DC}$, second transistor Q72, second I/O feedback capacitor $C_{F2}$, second I/O variable feedback resistor $VR_{F2}$, second emitter resistor $R_{E2, DC}$, inductor $L_E$ and variable emitter resistor $VR_{E, AC}$.

As illustrated in the embodiment shown in FIG. 7, first and second transistors Q71 and Q72 are shown as bipolar junction transistors (BJTs) and, specifically, NPN BJTs. However, in other embodiments, first and second transistors Q71 and Q72 can be an HBT, MOSFET device, MESFET device or other transconductor or transistor technology device. In addition, first and second transistors Q71 and Q72 can be either single device configuration or multiple device configuration, such as a Darlington configuration shown in FIG. 2. Although FIG. 7 illustrates first and second transistors Q71 and Q72 in a common emitter configuration, other embodiments may implement other configurations. In one embodiment, emitter area of a BJT implementation of first and second transistors Q71 and Q72 may be approximately 300 μm².

A first variable feedback between first input IN$_1$ and first output OUT$_1$ and between the base and collector of first transistor Q71 comprises first I/O feedback capacitor $C_{F1}$ and first I/O variable feedback resistor $VR_{F1}$ coupled in serial. A second variable feedback between second input IN$_2$ and second output OUT$_2$ and between the base and collector of second transistor Q72 comprises second I/O feedback capacitor $C_{F2}$ and second I/O variable feedback resistor $VR_{F2}$ coupled in serial. A third variable feedback coupled between a first emitter of first transistor Q71 and a second emitter of second transistor Q72 comprises variable emitter resistor $VR_{E, AC}$. Each variable feedback may comprise one or more variable components and may also comprise one or more fixed components. The type and variable range of variable components in each feedback may vary from one embodiment to the next.

A first terminal of first emitter resistor $R_{E1, DC}$ is coupled to the emitter of first transistor Q71 and a second terminal of first emitter resistor $R_{E1, DC}$ is coupled to the second terminal of second emitter resistor $R_{E2, DC}$ and a first terminal of inductor $L_E$. A first terminal of second emitter resistor $R_{E2, DC}$ is coupled to the emitter of second transistor Q72 and the second terminal of second emitter resistor $R_{E2, DC}$ is coupled to the second terminal of first emitter resistor $R_{E2, DC}$ and the first terminal of inductor $L_E$. A first terminal of inductor $L_E$ is coupled to the second terminals of first emitter resistor $R_{E1, DC}$ and second emitter resistor $R_{E2, DC}$ and a second terminal of inductor $L_E$ is coupled to ground GND.

The operation of differential VGA 70 is similar to the operation of single-ended VGA 20 except differential. In the differential variable feedback VGA 70, in some embodiments a relationship between a value of fixed first and second emitter resistors $R_{E1, DC}$ and $R_{E2, DC}$ and a default or initial value of variable emitter resistor $VR_{E, AC}$ may be designed according to Equations 3 and 4 below:

$$R_{E1, DC} \| (VR_{EAC}/2) \qquad \text{Equation 3}$$

$$R_{E2, DC} \| (VR_{EAC}/2) \qquad \text{Equation 4}$$

One advantage of utilizing variable emitter resistor $VR_{EAC}$ is that it is easier to maintain the DC bias current, which is generated by a DC bias circuit (not shown), relatively constant over a wide range of gain settings without utilizing additional devices in the bias circuit. In some embodiments, it may not be necessary to utilize variable emitter resistor $R_{E,AC}$. Emitter inductance $L_E$ is common mode emitter degeneration. Depending on the common mode rejection ratio (CMRR) requirement, emitter inductance $L_E$ may be implemented by on-chip components, e.g., by parasitic components, or by external components, e.g., provided on a printed circuit board (PCB).

There are many design, cost and/or performance advantages provided by embodiments of the invention relative to conventional high performance VGAs. Variable feedback architecture and variable feedback control techniques for variable gain amplifiers (VGAs) discussed herein concurrently maintain, across a wide range of VGA gain settings, minimal input and output impedance variations, a low noise figure, low rates of change in the noise figure, high signal-to-noise ratio (SNR), high quality of service (QoS), low distortion provides increased spurious-free dynamic range (SFDR), high output third order intercept point (i.e., IP3 or TOI) and low rates of change in the high output IP3. Variable feedback from variable components, for example, counteracts impedance variations caused by gain variations. Compared to conventional high performance VGAs, noise figure is lower (e.g. 3 dB lower at maximum gain and 12 dB lower at minimum gain) and relatively constant, IP3 is higher and relatively constant, small signal third order intermodulation signal (IM3) tone slope is relatively constant and input and output impedances are relatively constant. As gain decreases, the noise figure advantage is nearly dB per dB compared to conventional high performance VGAs. Embodiments of the invention have a small signal IM3 tone vs. input power slope of 3. These advantages contrast with some conventional VGAs advertised as having high IP3 when they only provide high IP3 for a small output power range.

Unlike prior art VGAs, embodiments of the invention achieve relatively constant input and output impedances in one stage without adding a series resistor at the input or adding additional output stages at the output. In prior art VGAs, an input series resistor increases its noise figure. In addition, output stages in prior art VGAs consume power and cause a bottle neck for amplifier linearity measured by the third order intercept point (IP3). Embodiments of the present invention permit simplicity at VGA output, which is desirable for high IP3 VGAs because amplifier output IP3 is usually limited by the output.

Input and output impedance may be the same or different among various embodiments. In some embodiments, an input (source) and/or an output (load) impedance may be, for example, 200 Ohms. Regardless of the particular embodiment, variable feedback may be varied to provide necessary gain while attempting to most closely match the reference input and output impedances across the gain range of the variable feedback VGA.

Depending on the embodiment and operating conditions, what is deemed relatively constant impedance may vary among embodiments. For example, in some embodiments relatively constant impedance may vary by a ratio of 2:1, which means that if the design impedance is 50 Ohms then impedance may vary between 25 and 100 Ohms. In other embodiments, a 20% or less change in input or output impedance to each incremental change in gain ratio (e.g. 1 dB) and a 50% or less total change in input or output impedance may be maintained over a wide range of gain settings (e.g. 5 dB, 10 dB, 14 dB).

A device, as defined herein, is a machine or manufacture as defined by 35 U.S.C. §101. A device may comprise, for example but not limited to, an amplifier, attenuator, intermediate frequency (IF) device, radio frequency (RF) device, wireless device, communications device, radio system, receiver, transmitter, transceiver, cellular base station equipment and other communications and wireless infrastructure equipment, etc. For example, embodiments of the invention can be implemented in one or more IF and RF stages of receivers, transmitters and transceivers. VGAs implemented in accordance with embodiments of the inventions may comprise Silicon-Germanium (SiGe) semiconductors or other semiconductors comprising other materials and alloys. In some embodiments, for example, a variable feedback VGA may be implemented between a SAW filter and ADC in a wireless communication receiver.

Embodiments of the invention may also be implemented in processes or methods. For example, one such method in accordance with an embodiment of the invention may comprise: determining a variable gain setting for a variable gain amplifier (VGA); determining a variable feedback setting for the VGA to provide the variable gain and compensate at least one of an input and an output impedance of the VGA; concurrently controlling a gain and at least one of the input and output impedance of the VGA based on the determined variable gain setting and the determined variable feedback setting; and maintaining a noise figure of the VGA, for example, at 5 dB or less over an at least 10 dB range of the gain settings of the VGA.

Another method may comprise: configuring, by selecting at least one setting of, at least one variable feedback of the VGA to concurrently: provide the determined variable gain; compensate at least one of an input and output impedance of the VGA to minimize a difference between, respectively, at least one of a reference input and a reference output impedance; and maintain a 0.4 dB or less change in noise figure for a 1 dB change in gain of the VGA. Configuring the at least one variable feedback of the VGA may comprise concurrently configuring, by selecting a plurality of settings for, a plurality of variable feedbacks. Concurrently configuring the plurality of variable feedbacks may comprise concurrently configuring complementary first and second variable feedbacks to provide at least a partially inverted function. Concurrently configuring the complementary first and second variable feedbacks may comprise concurrently configuring the first variable feedback to increase gain and increase the input and output impedance and the second variable impedance to increase gain and decrease the input and output impedance.

The method may further comprise: maintaining a 0.4 dB or less change in noise figure for a 1 dB change in gain over an at least 10 dB range of gain of the VGA. The method may further comprise: maintaining a 0.2 dB or less change in noise figure for a 1 dB change in gain over an at least 10 dB range of gain of the VGA. The method may further comprise: maintaining a noise figure of the VGA at 5 dB or less over an at least 10 dB range of the gain settings of the VGA. Some or all of the forgoing steps may be implemented concurrently, in order, out of order, with fewer steps, with additional steps or with different steps.

Techniques described herein may be implemented in hardware (digital and/or analog) or a combination of hardware, software and/or firmware. Techniques described herein may be implemented in one or more components. Embodiments of the invention may comprise computer program products comprising logic (e.g., in the form of program code or software as well as firmware) stored on any computer useable medium, which may be integrated in or separate from other components. Such program code, when executed in one or more processors, causes a device to operate as described herein. Devices in which embodiments may be implemented may include storage, such as storage drives, memory devices, and further types of computer-readable media. Examples of such computer-readable media include, but are not limited to, a hard disk, a removable magnetic disk, a removable optical disk, flash memory cards, digital video disks, random access memories (RAMs), read only memories (ROM), and the like. In greater detail, examples of such computer-readable media include, but are not limited to, a hard disk associated with a hard disk drive, a removable magnetic disk, a removable optical disk (e.g., CDROMs, DVDs, etc.), zip disks, tapes, magnetic storage devices, MEMS ( micro-eletromechanical systems) storage, nanotechnology-based storage devices, as well as other media such as flash memory cards, digital video discs, RAM devices, ROM devices, and the like. Such computer-readable media may, for example, store computer program logic, e.g., program modules, comprising computer executable instructions that, when executed, provide and/or maintain one or more aspects of functionality described herein with reference to FIGS. 2-7, as well as any and all components, steps and functions therein and/or further embodiments of the present invention described herein.

Proper interpretation of subject matter described herein and claimed hereunder is limited to patentable subject matter under 35 U.S.C. §101. Subject matter described in and claimed based on this patent application is not intended to and does not encompass unpatentable subject matter. As described herein and claimed hereunder, a method is a process defined by 35 U.S.C. §101. As described herein and claimed hereunder, each of a circuit, device, converter, apparatus, machine, system, computer, module, media and the like is a machine and/or manufacture defined by 35 U.S.C. §101.

While the present invention has been described with respect to a limited number of embodiments, those skilled in the art will appreciate numerous modifications and variations there from. Embodiments have been presented by way of example only, and not limitation. It will be apparent to persons skilled in the relevant art(s) that various changes in form and details can be made therein without departing from the spirit and scope of the invention. The exemplary appended claims encompass embodiments and features described herein, modifications and variations thereto as well as additional embodiments and features that fall within the true spirit and scope of this present invention.

What is claimed:

1. A device comprising a variable gain amplifier having at least one variable feedback, wherein the at least one variable feedback comprises a plurality of variable components provided with coordinated control to concurrently control gain, compensate at least one of input and output impedance and maintain a 0.4 dB or less change in noise figure per 1 dB change in gain of the amplifier over an at least 5 dB range of gain of the amplifier.

2. The device of claim 1, wherein the at least one variable feedback comprises a plurality of variable feedbacks each having at least one of the plurality of variable components.

3. The device of claim 2, wherein at least two of the plurality of variable components are configured to provide at least one complementary control function.

4. The device of claim 3, wherein a first feedback concurrently increases gain and decreases the at least one of input and output impedance and a second feedback concurrently increases gain and increases the at least one of input and output impedance, thereby providing the complementary control function.

5. The device of claim 1, wherein the variable feedback is configured to vary to maintain a 0.4 dB or less change in noise figure per 1 dB change in gain over an at least 10 dB range of gain of the VGA.

6. The device of claim 1, wherein the variable feedback is configured to vary to maintain a 0.2 dB or less change in noise figure for a 1 dB change in gain over an at least 10 dB range of gain of the VGA.

7. The device of claim 1, wherein the variable feedback is configured to vary to maintain the noise figure at 5 dB or less over an at least 10 dB range of gain of the VGA.

8. The device of claim 1, wherein the variable feedback is configured to vary to maintain a 50% or less change in at least one of the input and output impedance of the amplifier over an at least 10 dB range of gain of the VGA.

9. The amplifier of claim 1, further comprising a variable feedback controller configured to control the variable feedback.

10. A device comprising a variable gain amplifier having at least two variable feedbacks configured to provide at least one complementary control function and to provide concurrent control of gain, compensation of at least one of input and output impedance and maintenance of a 0.4 dB or less change in noise figure per 1 dB change in gain of the amplifier over an at least 5 dB range of gain of the amplifier.

11. The device of claim 10, wherein the at least two variable feedbacks comprise a first variable impedance component coupled between an input and an output of the amplifier and a second variable impedance component coupled to ground.

12. The device of claim 11, wherein the amplifier comprises a common emitter (CE) configured bipolar device having a base, collector and emitter, wherein the first variable impedance is coupled between the base and collector and the second variable impedance is coupled between the emitter and ground.

13. The device of claim 12, wherein the first variable impedance is configured to concurrently increase gain and increase the input and output impedance and the second variable impedance is configured to concurrently increase gain and decrease the input and output impedance, thereby providing the at least one complementary control function.

14. The device of claim 10, wherein the amplifier is differential and a first variable feedback is coupled between a first collector and a first base of a first bipolar device, a second variable feedback is coupled between a second collector and a second base of a second bipolar device and a third variable feedback is coupled between a first emitter of the first bipolar device and a second emitter of a second bipolar device.

15. The device of claim 10, wherein the amplifier comprises a single stage.

16. A device comprising a controller configured to control at least two variable feedbacks in a variable gain amplifier to provide at least one complementary control function and to provide concurrent control of gain, compensation of at least one of input and output impedance and maintenance of a 0.4 dB or less change in noise figure per 1 dB change in gain of the amplifier over an at least 5 dB range of gain of the amplifier.

17. The device of claim 16, wherein a first variable feedback concurrently increases gain and decreases the at least one of input and output impedance and a second variable feedback concurrently increases gain and increases the at least one of input and output impedance.

18. The device of claim 16, wherein the controller is configured to control the at least two variable feedbacks in the variable gain amplifier to maintain a 0.4 dB or less change in noise figure per 1 dB change in gain over an at least 10 dB range of gain of the VGA.

19. The device of claim 17, wherein the controller comprises a computer readable medium having computer executable instructions, component settings or information used to control the at least two variable feedbacks.

20. The device of claim 18, wherein the controller is configured to control the at least two variable feedbacks in the variable gain amplifier to maintain the noise figure at 5 dB or less over an at least 10 dB range of gain of the VGA.

* * * * *